(12) United States Patent
Hsu (10) Patent No.: US 9,620,741 B2
(45) Date of Patent: Apr. 11, 2017

(54) METHOD OF MANUFACTURING A DISPLAY DEVICE

(71) Applicant: Japan Display Inc., Tokyo (JP)

(72) Inventor: Hsiang Lun Hsu, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 15/092,801

(22) Filed: Apr. 7, 2016

(65) Prior Publication Data

US 2016/0301034 A1    Oct. 13, 2016

(30) Foreign Application Priority Data

Apr. 10, 2015    (JP) .................................. 2015-080921

(51) Int. Cl.
*H01L 51/52*    (2006.01)

(52) U.S. Cl.
CPC .............................. *H01L 51/5275* (2013.01)

(58) Field of Classification Search
CPC .................................................. H01L 51/5275
See application file for complete search history.

(56) References Cited

U.S. PATENT DOCUMENTS

| | | | | |
|---|---|---|---|---|
| 5,771,085 A * | 6/1998 | Ochi | ................. | G02F 1/133526 349/158 |
| 6,396,559 B1 * | 5/2002 | Kishimoto | .......... | G02F 1/13394 349/123 |
| 6,476,550 B1 | 11/2002 | Oda et al. | | |
| 8,446,093 B2 | 5/2013 | Kim et al. | | |
| 8,592,833 B2 | 11/2013 | Lee et al. | | |
| 2002/0063834 A1 * | 5/2002 | Sawasaki | .......... | G02F 1/133707 349/130 |
| 2003/0116865 A1 * | 6/2003 | Yamaguchi | ......... | H01L 23/3107 257/779 |
| 2005/0275342 A1 * | 12/2005 | Yanagawa | ............. | H01L 27/322 313/504 |
| 2008/0032235 A1 * | 2/2008 | Chang | ................. | H01L 27/1214 430/313 |
| 2009/0322718 A1 * | 12/2009 | Higashida | ............ | G09G 3/3225 345/205 |
| 2010/0090592 A1 * | 4/2010 | Shiobara | ............. | H01L 27/3211 313/504 |
| 2010/0181586 A1 * | 7/2010 | Kim | ...................... | H01L 33/382 257/98 |
| 2011/0001158 A1 * | 1/2011 | Kim | .................... | H01L 21/0242 257/98 |
| 2011/0159201 A1 * | 6/2011 | Park | ........................ | C23C 14/04 427/469 |
| 2011/0171397 A1 * | 7/2011 | Lee | ........................ | C23C 14/042 427/468 |

(Continued)

*Primary Examiner* — Calvin Choi
*Assistant Examiner* — S. M. S Imtiaz
(74) *Attorney, Agent, or Firm* — Typha IP LLC (57) ABSTRACT

A method for manufacturing a display device is provided including forming a light emitting element by stacking in sequence a pixel electrode, light emitting layer and common electrode above a substrate, and forming an organic material pattern including a plurality of protrusions by evaporating an organic material above the common electrode, wherein the evaporation is performed under a reduced pressure in at a substrate temperature that is equal to or less than a glass transition temperature of the organic material.

15 Claims, 12 Drawing Sheets

(56) References Cited

U.S. PATENT DOCUMENTS

| | | | |
|---|---|---|---|
| 2012/0074438 A1* | 3/2012 | Hwang | H01L 33/0095 257/88 |
| 2013/0016299 A1* | 1/2013 | Takama | G02F 1/133512 349/57 |
| 2013/0112958 A1* | 5/2013 | Li | H01L 27/3211 257/40 |
| 2014/0077171 A1* | 3/2014 | Yamakita | G02B 5/201 257/40 |
| 2014/0091705 A1* | 4/2014 | Adachi | H01L 51/525 313/504 |
| 2014/0097455 A1* | 4/2014 | Ono | H01L 27/124 257/91 |
| 2014/0138613 A1* | 5/2014 | Kim | H01L 33/005 257/13 |
| 2014/0312337 A1* | 10/2014 | Isobe | H01L 51/5231 257/40 |
| 2015/0028325 A1* | 1/2015 | Seki | G03F 7/165 257/40 |
| 2015/0087093 A1* | 3/2015 | Sakano | H01L 51/0024 438/27 |

* cited by examiner

METHOD OF MANUFACTURING A DISPLAY DEVICE

CROSS REFERENCE TO RELATED APPLICATIONS

This application is based upon and claims the benefit of priority from the prior Japanese Patent Application No. 2015080921, filed on Apr. 10, 2015, the entire contents of which are incorporated herein by reference.

FIELD

The present invention is related to a display device. One embodiment disclosed by the present invention is related to a manufacturing method of a pixel of a display device.

BACKGROUND

An organic electroluminescence (referred to herein as "organic EL") display device is arranged with a light emitting element in each pixel and displays an image by individually controlling the light emission. A light emitting element includes a structure in which a layer (referred to herein as "light emitting layer") including an organic EL material is sandwiched between a pair of electrodes regarded as an anode electrode and a cathode electrode. The organic EL display device is arranged with one electrode as a pixel electrode for each pixel and the other electrode is arranged as a common electrode extending over a plurality of pixels, and applied with a common voltage. The organic EL display device controls light emission from a pixel by applying a voltage of the pixel electrode to each pixel with respect to the voltage of the common electrode.

Improving the extraction efficiency of light is given as an issue for self-light emitting display devices such as an organic EL display device. For example, in an organic EL display device, since light is emitted almost isotropically within a transparent light emitting layer with a relatively large refractive index, a part of the light is totally reflected by a boundary of the light emitting layer and not able to discharge the light to the exterior from the light emitting layer, which prevents improvement in light extraction efficiency A technique is known in which light extraction efficiency is improved by arranging a protrusion shaped pattern (also referred to as "microlens") using an organic material for example, on the display surface side with respect to a light emitting layer.

For example, an organic EL element is disclosed in the specification of U.S. Pat. No. 6,476,550 in which light extraction efficiency is improved by forming a diffraction lattice on a cathode reflective surface. A display device is disclosed in the specification of U.S. Pat. No. 8,446,093 in which a sealing layer is arranged above a pixel stacked with a reflection electrode, EL layer and common electrode, and a microlens is arranged by molding the surface of the sealing layer. In addition, a display device is disclosed in the specification of U.S. Pat. No. 8,592,833 in which a microlens is arranged between a surface of a sealing layer or organic EL layer and the sealing layer.

SUMMARY

An embodiment of the present invention is a manufacturing method of a display device which includes forming a light-emitting element by stacking in sequence an anode electrode, a light emitting layer and a cathode electrode above a substrate, and forming an organic material pattern including a plurality of protrusions by evaporating an organic material above the cathode electrode, where the evaporating is performed under a reduced pressure at a substrate temperature range of a glass transition temperature of the organic material.

DESCRIPTION OF EMBODIMENTS

The embodiments of the present invention are explained below while referring to the diagrams. However, it is possible to implement the present invention using various different forms, and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. Furthermore, in the specification and each drawing, the same reference symbols are attached to same elements and elements that have been mentioned in previous drawings, and therefore a detailed explanation may be omitted where appropriate.

In the present specification, in the case where certain parts or regions are given as [above (or below)] other parts or regions, as long as there is no particular limitation, these include parts which are not only directly above (or directly below) other parts or regions but also in an upper direction (or lower direction), that is, other structure elements may be included between other parts or regions in an upper direction (or lower direction).

Since a conventional microlens structure was formed using a wet process or printing method and the like, it is necessary to introduce new facilities and mass productivity is poor. In addition, it is necessary to arrange a microlens above a sealing film to prevent damage to a pixel particularly in a printing method. In this structure, a sealing layer and the like is interposed between a light emitting surface of the light emitting element and the microlens and the effects produced by the microlens cannot be sufficiently obtained.

One object of the present invention is to improve production yield of a display device arranged with a microlens.

<First Embodiment>

Figure 1:
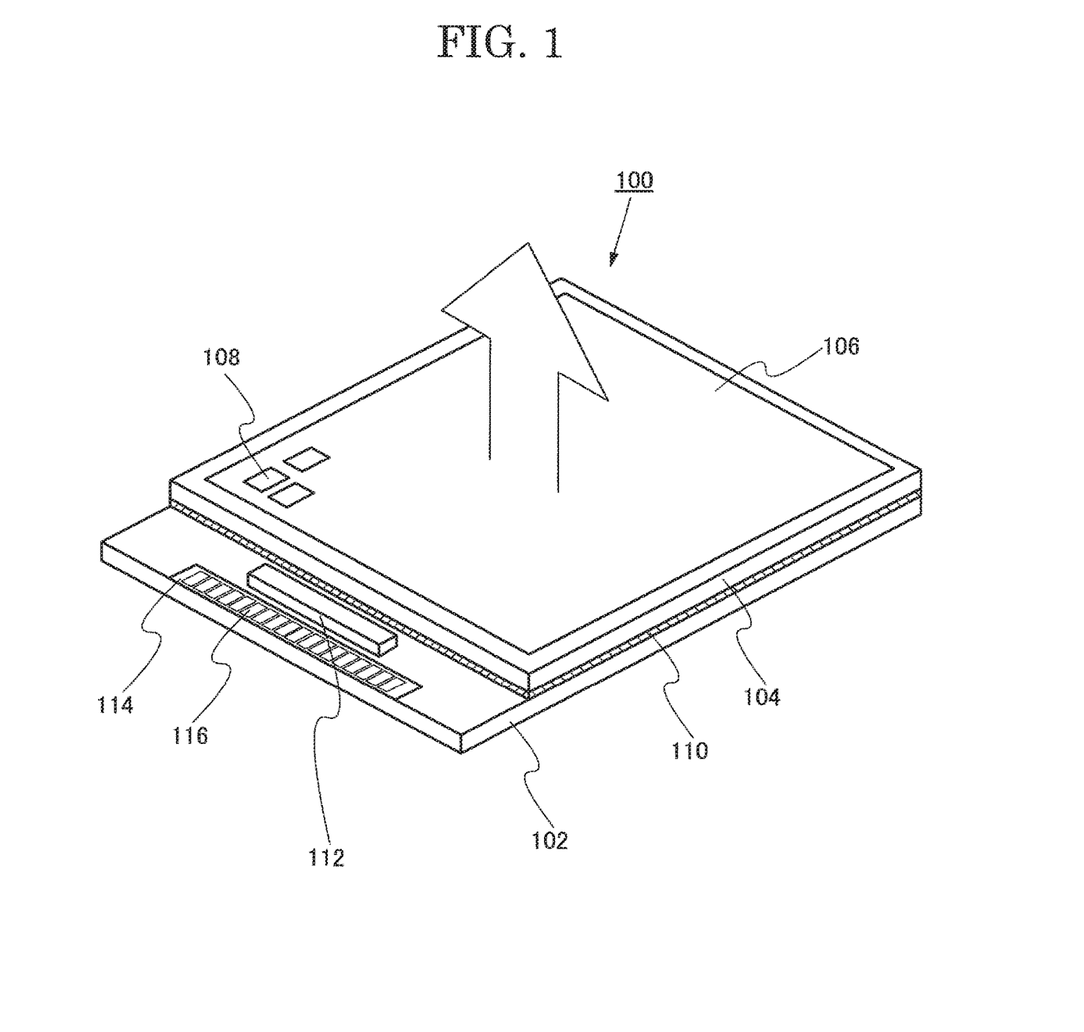
FIG. 1 is a perspective diagram showing a structure of a display device according to one embodiment of the present invention.

The structure of a display device 100 according to the present embodiment is explained with reference to FIG. 1. The display device 100 is arranged with a display region 106 on a first substrate 102. The display region 106 is formed by arranging a plurality of pixels 108. A second substrate 104 is arranged as a sealing member on an upper surface of the display region 106. The second substrate 104 is fixed to the first substrate 102 by a seal material 110 which encloses the display region 106. The display region 106 formed in the first substrate 102 is sealed by the second substrate 104 which is a sealing member and the seal material 110 so that the display region 106 is not exposed to air. Degradation of a light emitting element arranged in a pixel 108 is suppressed by this sealing structure.

The first substrate 102 is arranged with a terminal region 114 at one end. The terminal region 114 is arranged in a periphery region above the second substrate 104. The terminal region 114 includes a plurality of connection terminals 116. A connection terminal 116 forms a connection point with a wiring substrate which connects a display panel, such as a device which outputs a video signal or a power source. The connection point in the connection terminal 116 is exposed to the exterior. A driver circuit 112 for outputting a video signal input from the terminal region 114 to the display region 106 may also be arranged in the first substrate 102.

Figure 2:
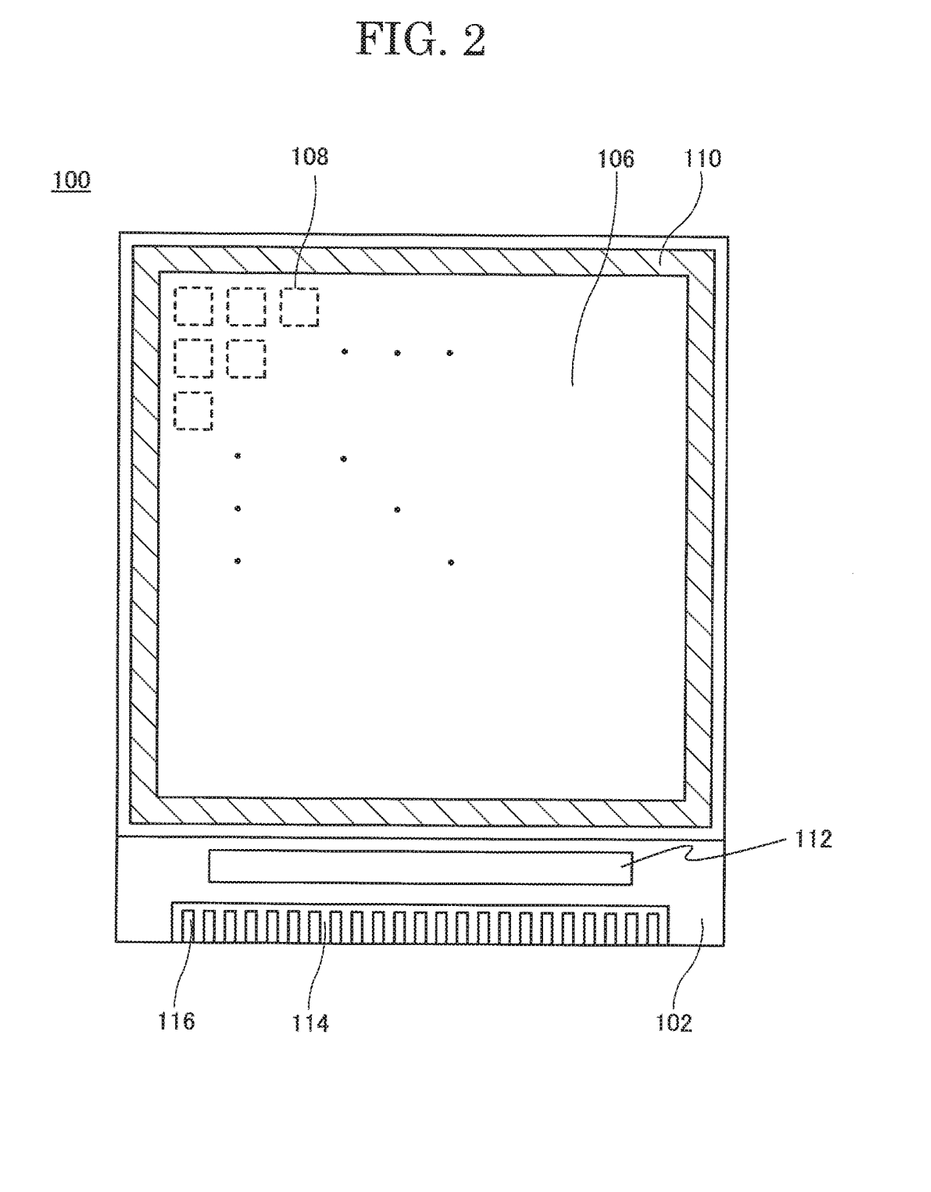
FIG. 2 is a planar diagram showing a structure of a display device according to one embodiment of the present invention.

The structure of the display device 100 according to the present embodiment is explained with reference to FIG. 2, FIG. 3A and FIG. 3B. FIG. 2 is a planar diagram showing the structure of the display device 100 according to the present embodiment.

As shown in FIG. 2, a plurality of pixels 108 is arranged in a matrix form in the display region 106 which forms a display screen above the first substrate 102. A perpendicular scanning circuit and horizontal circuit and the like which input a signal to the display region 106 may also be added as other elements.

Figure 3A:
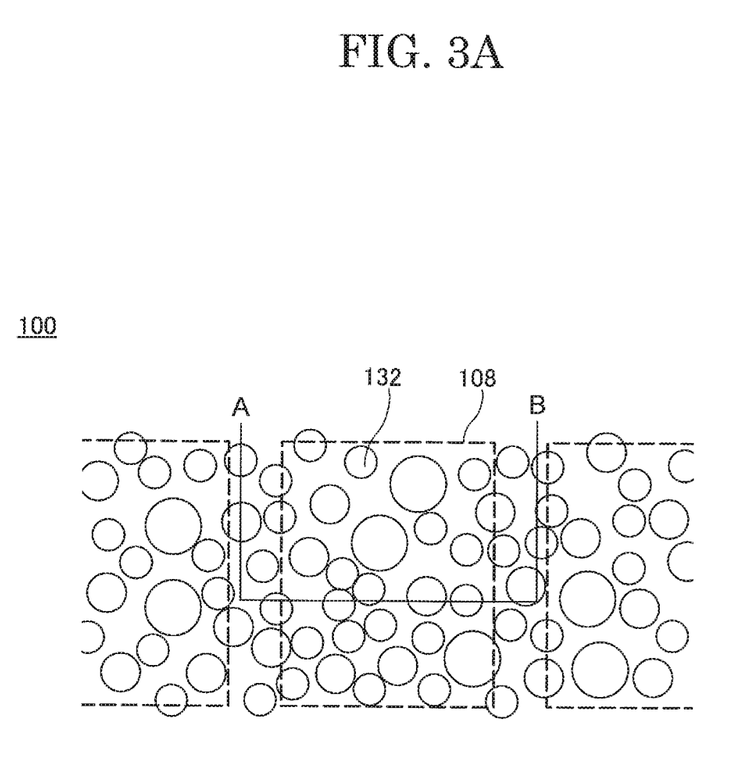
FIG. 3A is a planar diagram showing a structure of a display device according to one embodiment of the present invention.
Figure 3B:
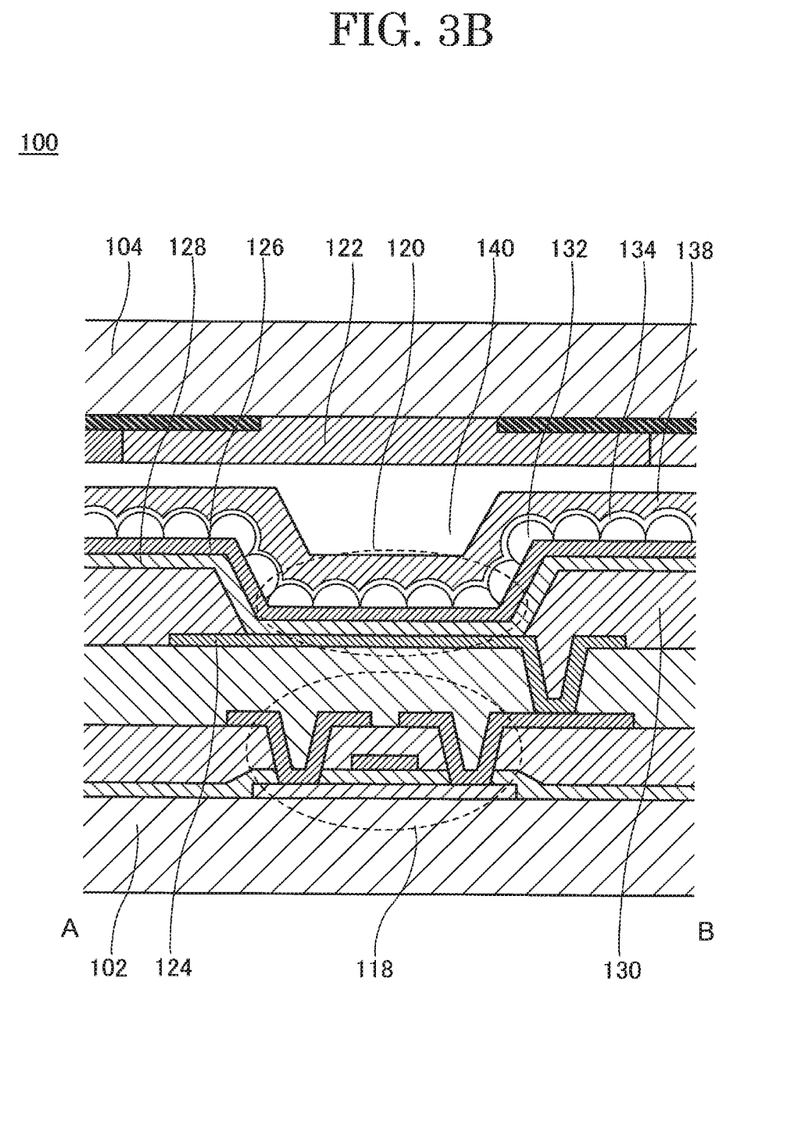
FIG. 3B is a cross-sectional diagram showing a structure of a display device according to one embodiment of the present invention.

FIG. 3A is a planar view diagram showing an expanded view of the display region 106 of the display device 100 according to the present embodiment. FIG. 3B is a cross-sectional structure along the line A-B of the display device 100 shown in FIG. 3A, As shown in FIG. 3B, each of the plurality of pixels 108 of the display region 106 includes a transistor 118 and a light-emitting element 120. In the case of an organic EL element for example, the light emitting element 120 includes a structure in which an organic layer 128 formed from an organic EL material is sandwiched by a pixel electrode 124 and a common electrode 126 opposing the pixel electrode 124. The pixel electrode 124 is independent to each pixel and is connected to the transistor 118. Within the organic layer 128, a region which forms a diode from the pixel electrode 124, organic layer 128 and common electrode 126 serves as a light emitting region. Here, the organic layer 128 is referred to as a light emitting layer in the present embodiment.

Since the pixel electrode 124 reflects light emitted from the light-emitting layer 128 to the side of the common electrode 126, it is preferred that the pixel electrode 124 be formed from a metal film having high reflectance. Alternatively, the pixel electrode 124 may be formed by a stacked structure of a metal film and a transparent conductive film, and a structure including a light reflecting surface is also possible.

A bank 130 is arranged between two adjacent pixels 108. The bank 130 is arranged so that an end part covers a periphery edge part of the pixel electrode 124.

The bank 30 prevents shorting between the pixel electrode 124 and common electrode 126 due to the pixel electrode insufficiently covered by the light-emitting layer 128. The bank 130 insulates adjacent pixels 108. Therefore the bank 130 is preferred to be formed from an insulation material. For example, it is preferred to use an organic material such as a polyimide, and acryl or an inorganic material such as silicon oxide when forming the bank 130.

The light emitting layer 128 is arranged in common with a plurality of pixels 108 and is arranged to cover the bank 130 arranged between the pixel electrodes 124 and between the pixels 108.

In the case where the light emitting layer 128 contains an organic EL layer for example, a low molecular-weight organic material or a high is molecular-weight organic material is used. In the case where a low molecular-weight organic material is used, in addition to the light emitting layer 128 including an organic material with light emitting properties, a structure including a hole injection layer or an electron injection layer, or a hole transport layer or electron transport layer which sandwich the light emitting layer 128 is available. In the present embodiment, the light emitting layer 128 uses a component that emits white light and full color display is realized using a color filter 122.

Since the common electrode 126 allows light emitted by the light emitting layer 128 to pass through, it is preferred that the common electrode 126 has translucency and is formed from a transparent thin film such as ITO (indium doped with tin oxide) or IZO (Indium zinc oxide) having conductive properties. In addition, the common electrode 126 may also be formed using a metal film to a thickness that allows emitted light to pass through.

A plurality of protrusion-shaped patterns 132 are formed above the common electrode 126. The protrusion shaped-pattern 132 includes a curved surface which may also be a spherical surface. In addition, the protrusion shaped pattern 132 has translucency and can be formed by a vapor deposition method. Although the size of the pattern depends on the conditions of the vapor deposition, typically it is possible to form a spherical body with a diameter of 0.1 µm or more and 10 µm or less and a height of 0.01 µm or more and 0.5 µm or less. By controlling the vapor deposition conditions, it is possible to form 100 or more and 1000000 or less protrusion-shaped patterns per pixel.

The protrusion-shaped pattern 132 is formed by evaporating a raw material in the form of a gas onto the surface of the common electrode 126 and controlling a surface reaction. For example, the protrusion-shaped pattern 132 can be formed using a vapor deposition method. The growth conditions of the protrusion-shaped pattern 132 can be controlled by the substrate temperature at the time of vapor deposition, the temperature of the vapor source, the time of the vapor deposition and vacuum level and the like. Furthermore, an interfacial free energy between the protrusion-shaped pattern and a lower layer thereof is a likely cause of significantly affecting the form of the protrusion shaped pattern 132.

The shape, height, dispersion in size and density of the protrusion-shaped pattern 132 depend on the conditions mentioned above and are determined in order to minimize surface energy, In particular, the substrate temperature at the time of vapor deposition predominantly determines the surface shape of the plurality of protrusion-shaped patterns to be formed. In addition, the temperature of the vapor source and type of a lower film predominantly determines the size, variation in size and density of the plurality of protrusion-shaped patterns 132.

The protrusion shaped pattern 132 functions as a lens. Light emitted to the common electrode 126 from the light emitting layer 128 can be emitted to the interior of the protrusion-shaped pattern 132 including an organic material with a comparatively high refractive index without being totally reflected by the boundary of the display surface side of the common electrode 126. The light emitted to the protrusion-shaped pattern 132 is discharged to the exterior by being condensed by a curved shaped boundary and thereby light extraction efficiency is improved.

Although a manufacturing method is described below, according to the present embodiment, since it is possible to form a self-aligned protrusion shaped pattern 132 using a vapor deposition method without using a wet process or printing method, it is possible to divert devices for forming other organic layers without the need to increase the amount of new manufacturing devices and thereby the protrusion shaped pattern 132 can be formed at low cost.

As the organic material of the protrusion shaped pattern 132 according to the present embodiment, it is preferred to use a material which does not have a glass transition temperature or has a higher glass transition temperature than a temperature experienced in a later thermal treatment process. For example, it is possible to use NPB (N,N-di (naphthalen-1-yl) —N,N-diphenylbenzidene), TPD (N,N'-Bis(3-methylphenyl) —N,N'-diphenylbenzidine) and the like.

Since the protrusion-shaped pattern 132 includes an organic material, it is preferred to arrange a first protection layer (referred to herein as "pattern protection layer") to cover the protrusion-shaped pattern 132. It is preferred to use an inorganic material such as silicon nitride (SiNx), silicon oxynitride (SiNxOy) or silicon oxide (SiOx) as the pattern protection layer 134.

The sealing film 138 which is a second protection film is further arranged above the pattern protection layer 134. The sealing film 138 is preferred to be a film which can block the infiltration of moisture. It is possible to use an inorganic insulation material or an organic insulation material as the sealing film 138.

For example, in the case where an inorganic insulation film is used as an insulation film, it is possible to use silicon oxide (SiOx), silicon nitride (SiNx), silicon oxynitride (SiOxNy), silicon nitroxide (SiNxOy), aluminum oxide (AlOx), aluminum nitride (AlNx), aluminum oxynitride (AlOxNy), aluminum nitroxide (AlNxOy) (x and y are integers), and the like. In addition, a structure in which these films are stacked may also be used. A plasma CVD method or a sputtering method can be used as the film formation method.

In the case where an organic insulation film is used as an insulation film, it is possible to use polyimide resin, an acryl resin, an epoxy resin, a silicon resin, a fluororesin or a siloxane resin, and the like. In addition, a structure in which these films are stacked may also be used. A vapor deposition method or vapor deposition polymerization method can be used as the film formation method.

Furthermore, a stacked structure in which the inorganic insulation films and organic insulation films described above are combined may also be used as the sealing film 138.

The first substrate 102 is covered by the transparent second substrate 104 which has a gap from the first substrate 102 maintained by the seal member 110. A space enclosed by the seal member 110, sealing film 138 and the second substrate 104 is filled with a filler material 140 including a transparent epoxy resin.

<Manufacturing Method>

A manufacturing method of the display device 100 related to the present embodiment is explained with reference to FIG. 4A to FIG. 4D and FIG. 6. FIG. 4A to FIG. 4D are cross-sectional diagrams showing a manufacturing method of a display device 200 related to the present embodiment and FIG. 5 is a manufacturing flow diagram.

Figure 4A:
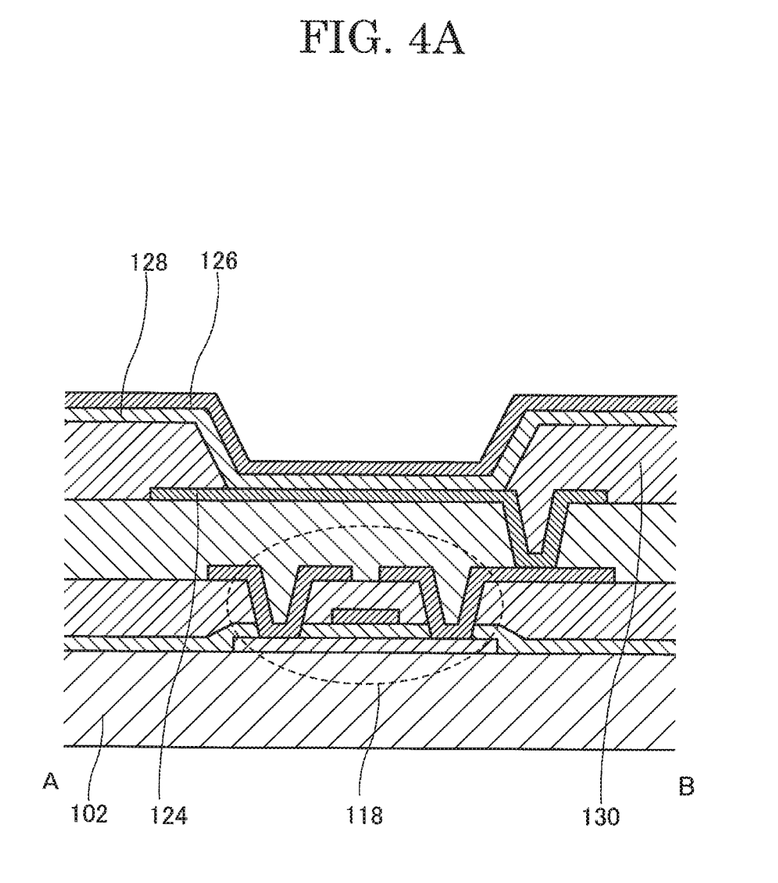
FIG. 4A is a cross-sectional diagram for explaining a manufacturing method of a display device according to one embodiment of the present invention.
Figure 5:
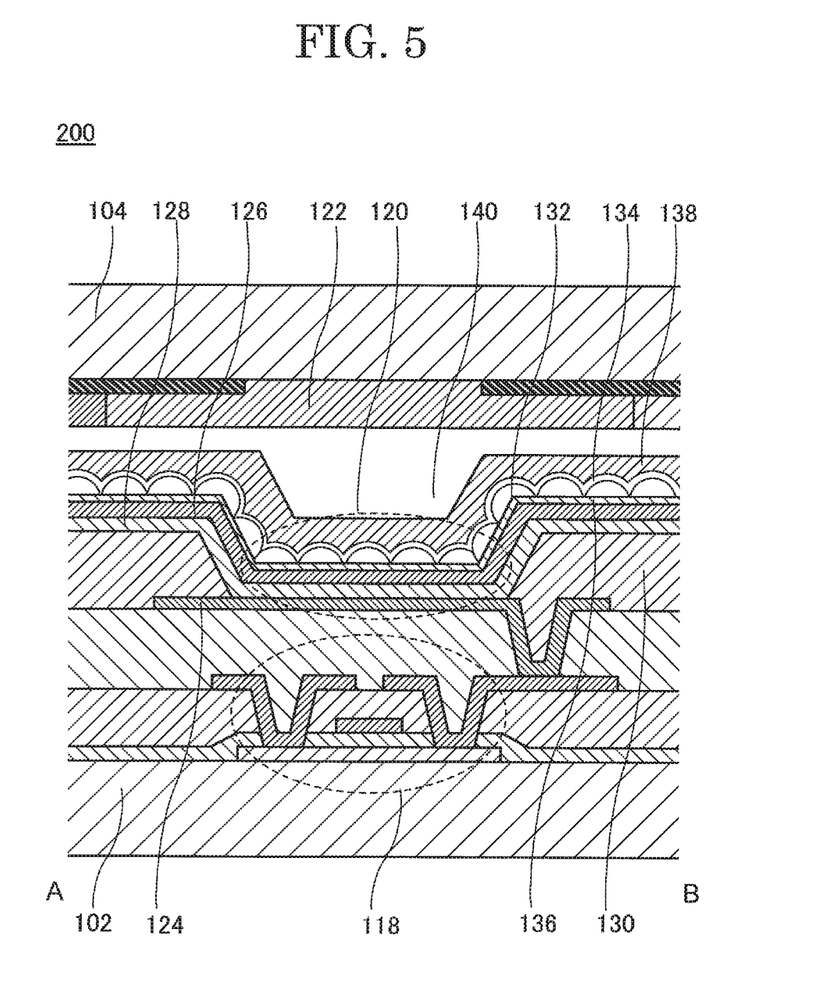
FIG. 5 is a cross-sectional diagram showing a structure of a display device according to one embodiment of the present invention.
Figure 6:
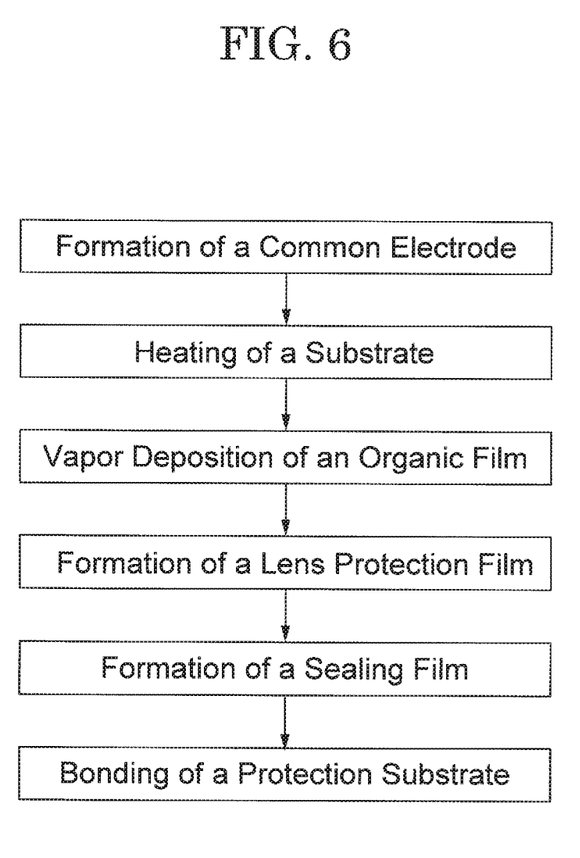
FIG. 6 is a flow diagram for explaining a manufacturing method of a display device according to one embodiment of the present invention.

FIG. 4A is a cross-sectional diagram at a stage up to formation of the common electrode 126. A process for forming elements such as transistors 118 forming a pixel circuit and a process for forming the light emitting element 120 in each pixel are included at this stage.

First, a pixel circuit is formed above the first substrate 102. At this time, a scanning line drive circuit, a video signal line drive circuit and an input terminal part are formed according to necessity. Each element such as a transistor or capacitor which forms a pixel circuit is formed by a thin film-stacked layer using a semiconductor, an insulator and a metal and by repeating patterning using photolithography.

Next, the light emitting element 120 is formed. The light emitting element 120 is formed by stacking the pixel electrode 124, the light emitting layer 128, and the common electrode 126 in sequence.

The pixel electrode 124 is formed using a photolithography process. Since the pixel electrode 124 reflects light emitted from the light emitting layer 128 to the side of the common electrode 126, it is preferred that the pixel electrode 124 is formed using a metal film with high reflectance. Alternatively, the pixel electrode 124 may have a stacked structure of a metal film and a transparent conductive film or a structure including a light reflective surface.

The bank 130 is formed in the display region 106 to cover a periphery edge part of the pixel electrode 124. The bank 130 is formed by an insulation material. It is possible to use an organic material or an inorganic material as the insulation material. It is preferred to use a polyimide or an acryl and the like as the organic material, and it is possible to use silicon oxide and the like as the inorganic material.

The light-emitting layer 128 is formed on the display region 106 of the first substrate 102. Furthermore, although an example is shown where only the light emitting layer 128 is formed in the present embodiment, in the case of an organic EL element, a functional layer such as an electron injection layer, electron transport layer, hole injection layer and hole transport layer may also be formed by a vapor deposition method using a single vapor deposition mask.

Next, a transparent electrode layer which serves as the common electrode 126 is formed on the display region 106 of the first substrate 102. Since the common electrode 126 which serves as an underlying layer when forming the protrusion shaped pattern 132 allows light emitted from the light-emitting layer 128 to pass through, it is preferred that the common electrode 126 has translucency and is formed from a transparent material such as ITO (indium doped with tin oxide) or IZO (Indium zinc oxide) having conductive properties. In the present embodiment, ITO is used as the common electrode 126.

Figure 4B:
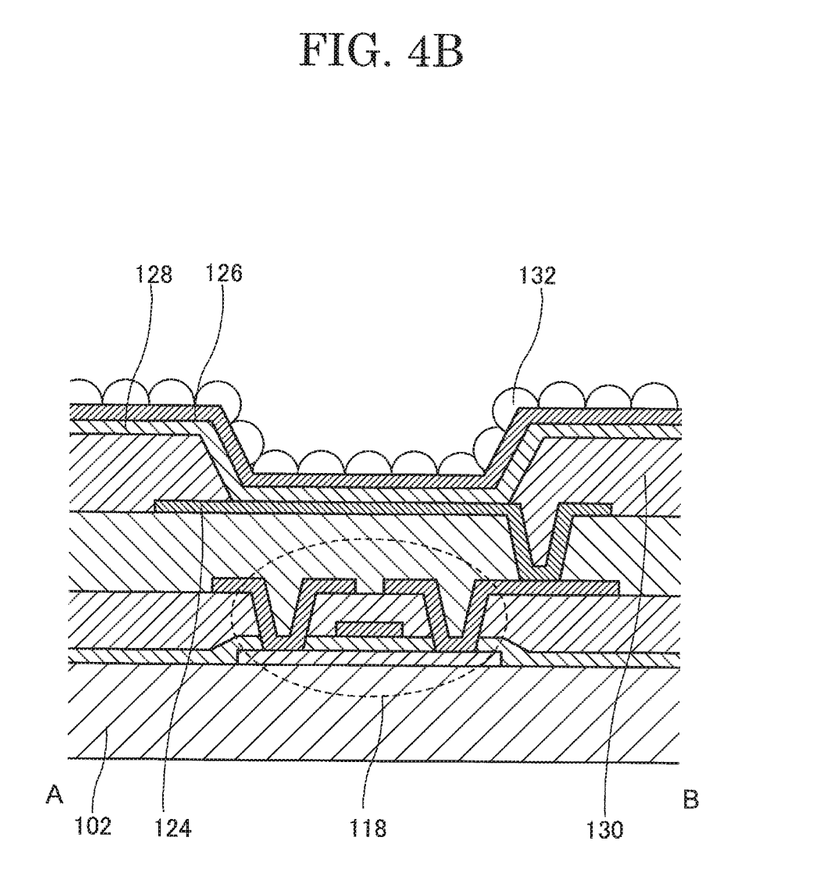
FIG. 4B is a cross-sectional diagram for explaining a manufacturing method of a display device according to one embodiment of the present invention.

As shown in FIG. 4B, after forming the common electrode 126, the protrusion shaped pattern 132 is formed thereupon. This pattern can be formed by evaporating an organic material using a vapor deposition method.

As the film formation conditions, a substrate temperature is set lower than a glass transition temperature of the organic material. Preferably, the substrate temperature is below the grass transition temperature of an organic layer within a range of 70° C. to 100° C. so that damage is not applied to the organic layer within the light emitting element 120. A vacuum level is given as $10^{-5}$ Pa to $10^{-7}$ Pa, When a film formation process of the organic material is performed under the conditions described above, the organic material is evaporated so that a plurality of protrusion shapes is formed above the common electrode 126. Each of the protrusion shaped patterns formed at this time has a roughly spherical shape and a size whereby the diameter is 0.1 µm or more and 10 µm or less, a dispersion of the diameter of 0.01 µm or more and 0.1 µm or less and a height of 0.01 µm or more and 0.5 µm or less. About 1 to 10000 protrusion shaped patterns 132 having this size are arranged per square with one side of 10 µm. When calculating per pixel, it is possible to provide a display device arranged with 100 to 1000000 protrusion shaped patterns 132.

Furthermore, it is possible to adjust the size and density level of the protrusion-shaped pattern 132 by adjusting the film formation conditions. If a plurality of protrusion shaped patterns 132 are formed within one pixel, it is possible to suppress variation in luminosity between pixels.

The substrate temperature at the time of vapor deposition predominantly determines the surface shape of the plurality of protrusion shaped patterns 132 to be formed. In addition, the temperature of the vapor source and type of underlying layer predominantly determines the size, variation in size and density level of the plurality of protrusion shaped patterns 132.

In the formation of the protrusion shaped pattern 132 described above, since a self-aligning protrusion shaped pattern 132 can be formed using a vapor deposition method without using a wet process or printing method, it is possible to form the protrusion shaped pattern 132 using a process which is not significantly different from forming other organic layers and without the need to increase the amount of new manufacturing devices.

Figure 4C:
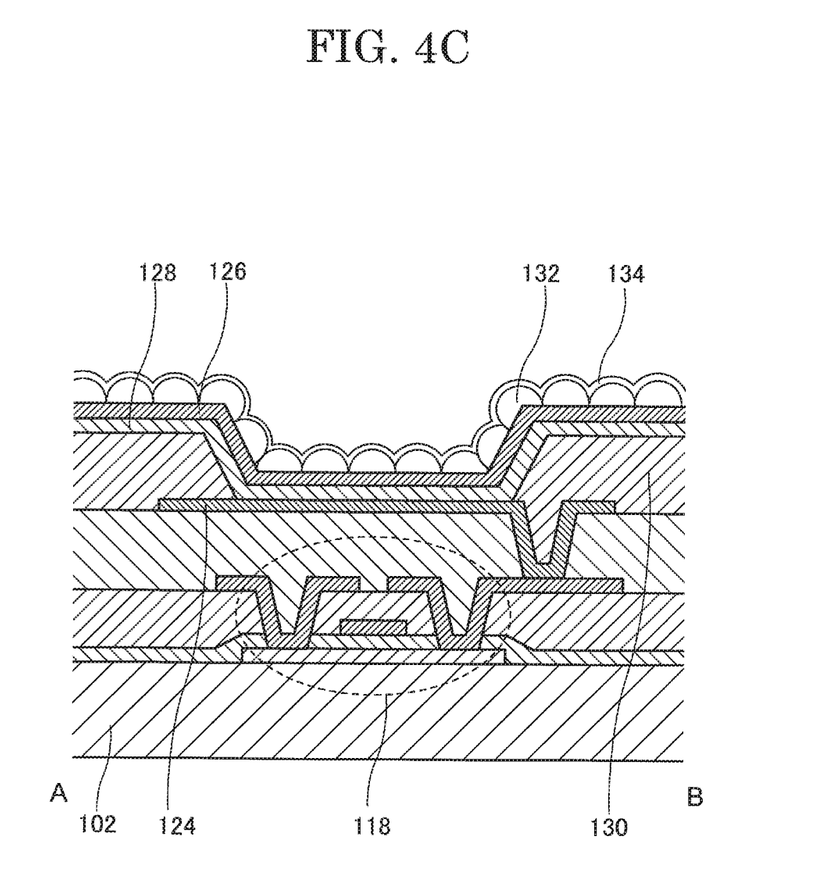
FIG. 4C is a cross-sectional diagram for explaining a manufacturing method of a display device according to one embodiment of the present invention.

As shown in FIG. 4C, a pattern protection film 134 may be formed above the protrusion shaped pattern 132. Since the protrusion shaped pattern 132 includes an organic film, it is preferred that an inorganic insulation film is arranged as the protection film 134. It is possible to use silicon nitride (SiNx), silicon oxynitride (SiNxOy) or silicon oxide (SiOx) as the inorganic insulation material. It is possible to use a plasma CVD method or sputtering method as the film formation method.

Figure 4D:
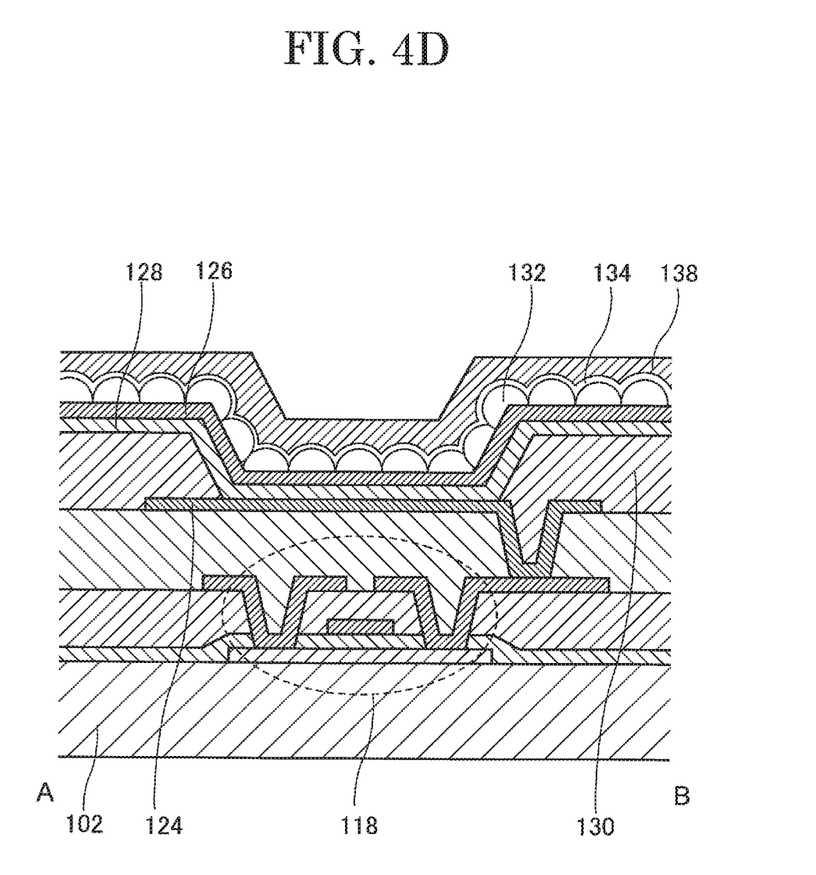
FIG. 4D is a cross-sectional diagram for explaining a manufacturing method of a display device according to one embodiment of the present invention.

As shown in FIG. 4D, the sealing film 138 which is a second protection layer is further formed above the protection layer 134. The sealing film 138 is preferred to be a film which can block the infiltration of water. It is possible to use an inorganic insulation film or an organic film as the sealing film 138.

For example, in the case where an inorganic insulation film is used as an insulation film, it is possible to use silicon oxide (SiOx), silicon nitride (SiNx), silicon oxynitride (SiOxNy), silicon nitryoxide (SiNxOy), aluminum oxide (AlOx), aluminum nitride (AlNx), aluminum oxynitride (AlOxNy), aluminum nitryoxide (AlNxOy) (x and y are integers), and the like. In addition, a structure in which these are stacked may also be used. A plasma CVD method or sputtering method can be used as the film formation method.

In the case where an organic insulation film is used as an insulation film, it is possible to use a film such as a polyimide resin, an acryl resin, an epoxy resin, a silicon resin, a fluororesin or a siloxane resin and the like. In addition, a structure in which these films are stacked may also be used. A vapor deposition method or vapor deposition polymerization method can be used as the film formation method.

Furthermore, a stacked structure in which the inorganic insulation films and organic insulation films described above are combined may also be used as the sealing film 138.

The first substrate 102 is covered by the transparent second substrate 104 which has a gap from the first substrate 102 maintained by the seal member 110. A space enclosed by the seal member 110, sealing film 138 and the second substrate 104 is filled with a filler material 140 including a transparent epoxy resin.

A manufacturing method of the display device 100 according to the preferred embodiments of the present invention was explained above. In the formation of the protrusion shaped pattern 132 according to the present embodiment, since a self-aligning protrusion shaped pattern 132 can be formed using a vapor deposition method without using a wet process or printing method, it is possible to form the protrusion shaped pattern 132 using a process which is not significantly different from forming other organic layers and without the need to increase the amount of new manufacturing devices.

<Second Embodiment>

Figure 7:
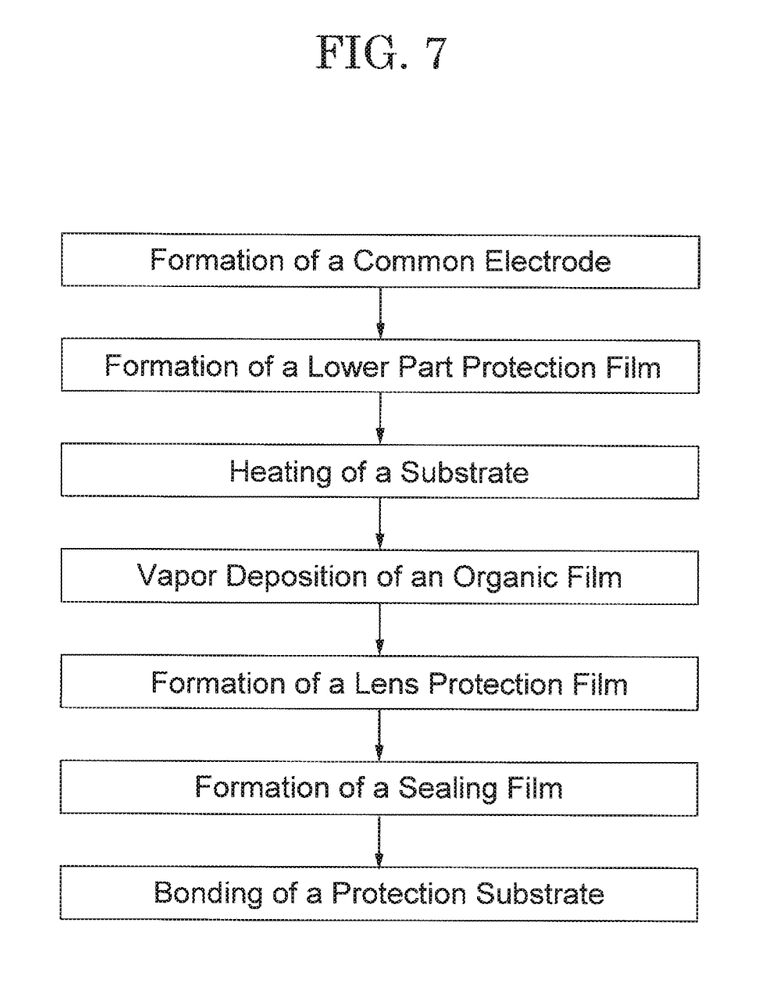
FIG. 7 is a flow diagram for explaining a manufacturing method of a display device according to one embodiment of the present invention.

A manufacturing method of a display device according to another embodiment is explained. FIG. 5 shows a display device 200 formed by the manufacturing method of a display device according to the present embodiment, and FIG. 7 shows a part of the manufacturing process of the display device. When compared with the display device 100, after forming a common electrode, a lower part protection film 136 which is a third protection film is arranged above the common electrode 126. Next, an organic material is evaporated in a state where a substrate is heated and the protrusion shaped pattern 132 is formed above the lower part protection film 136. Next, a sealing film is formed and a protection substrate is bonded.

The form, shape, number, size, variation in size, and density level of the protrusion shaped pattern 132 are dependent on the material of a lower layer thereof in addition to the substrate temperature and vacuum level at the time of formation. An interfacial free energy between the protrusion shaped pattern 132 and a lower layer thereof is a likely cause of significantly affecting the form of the protrusion-shaped pattern 132. A transparent film which does not apply damage to the light-emitting element when evaporating the pattern 132 is preferred as the lower part protection film 136. For example, it is possible to use an insulation film such as LIF formed by thermal vapor deposition.

It is possible to improve controllability of the form of the protrusion shaped pattern 132 by arranging the lower part protection film 136 which serves as a underlying layer of the protrusion shaped pattern 132.

<Third Embodiment>

Figure 8:
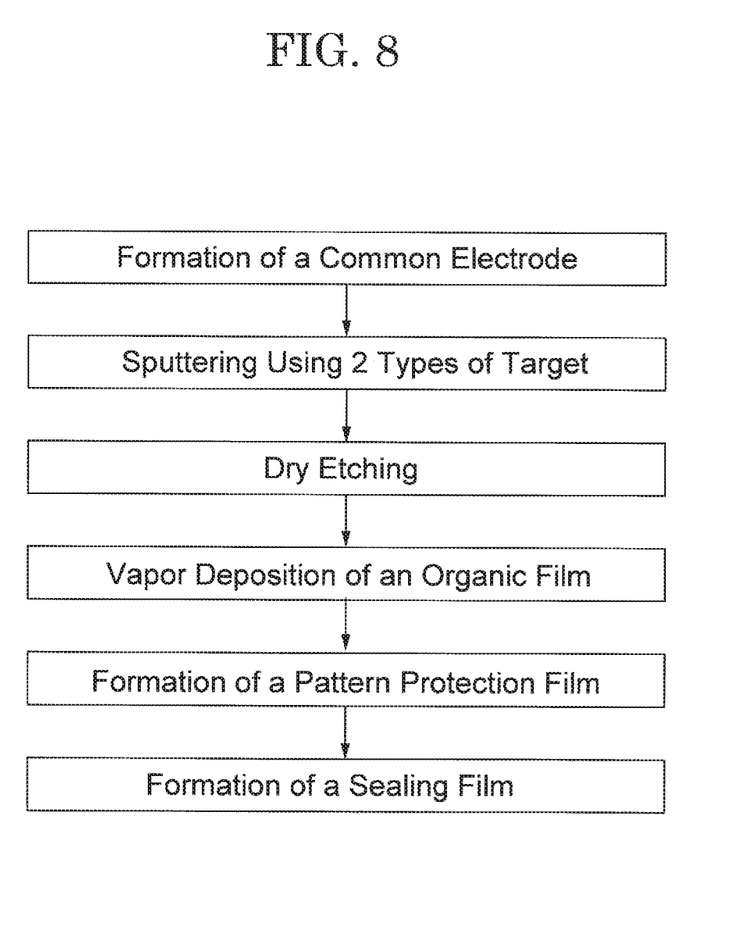
FIG. 8 is a flow diagram for explaining a manufacturing method of a display device according to one embodiment of the present invention.

FIG. 8 is a flow diagram showing a manufacturing method in the third embodiment. The processes up to formation of a common electrode are the same as those of the embodiments described above and are therefore omitted.

In the present embodiment, when forming the protrusion shaped pattern 132, after forming the common electrode 126, sputtering is performed using two types of target material to form a mixed film. Two types of target or a mixed target in which two types of material are mixed are used as the target when performing sputtering. For example, it is possible to use indium zinc oxide (IZO) and silicon nitride (SiN). In addition, titanium oxide (TiO2) and silicon nitride (SiNx) may also be used.

Next, a mixed film is dry-etched. At this time, one of the mixed materials is etched. Silicon nitride (SiNx) is etched using nitrogen trifluoride (NF3) and the protrusion shaped pattern 132 is formed. The protrusion shaped pattern 132 is a porous film.

Next, a pattern protection film including a material other than a mixed material is formed.

Next, the second substrate 104 is arranged so as to oppose a surface forming a light emitting element of the first substrate 102. A filler material 104 includes an epoxy resin with translucency is filled into a gap enclosed by the first substrate 104, seal member 110 and sealing film 138.

According to the present embodiment, since it is possible to form a pattern 132 using a vapor deposition method without using a wet process or printing method. It is possible to divert devices when film forming other organic layers without the need to increase the amount of new manufacturing devices and thereby the protrusion shaped pattern 132 can be formed at low cost.

A display device 100 and 200 according to the preferred embodiments of the present invention were explained above. However, these embodiments are merely examples and the technical range of the present invention is not limited to these embodiments. Actually, the present invention can be changed in various ways by a person ordinarily skilled in the art that does not depart from the concept of the present invention claimed in the scope of the patent claims. Therefore, these changes should also be interpreted as belonging to the technical scope of the present invention.

The invention claimed is:

1. A method for manufacturing a display device comprising:
    forming a light emitting element by stacking in sequence a pixel electrode, light emitting layer and common electrode above a substrate; and
    forming an organic material pattern including a plurality of protrusions by depositing an organic material after forming the common electrode;
    wherein the deposition is performed under a reduced pressure at a substrate temperature that is equal to or less than a glass transition temperature of the organic material.

2. The method for manufacturing a display device according to claim 1, wherein the substrate temperature range is 70° C. to 100° C.

3. The method for manufacturing a display device according to claim 1, wherein the deposition is performed under a vacuum of $10^{-5}$ Pa to $10^{-7}$ Pa.

4. The method for manufacturing a display device according to claim 3 further comprising
    forming a first protection film so as to cover a pattern including the plurality of protrusions.

5. The method for manufacturing a display device according to claim 4, wherein the pattern of the plurality of protrusions has a spherical surface.

6. The method for manufacturing a display device according to claim 5, wherein the pattern of the plurality of protrusions has a diameter of 0.1 μm or more and 10 μm or less.

7. The method for manufacturing a display device according to claim 6, wherein the pattern of the plurality of protrusions has a height of 0.01 μm or more and 0.5 μm or less.

8. The method for manufacturing a display device according to claim 7, wherein the pattern of the plurality of protrusions has a variation in diameter of 0.01 μm or more and 10 μm or less.

9. The method for manufacturing a display device according to claim 8, wherein the pattern of the plurality of protrusions is formed with 100 or more and 1000000 or less protrusion patterns per pixel.

10. The method for manufacturing a display device according to claim 9 further comprising
    forming a second protection film above the light emitting element before forming the pattern of the plurality of protrusions.

11. The method for manufacturing a display device according to claim 1, wherein the organic material pattern is formed directly on a flat surface of the common electrode.

12. The method for manufacturing a display device according to claim 1, wherein a plurality of protrusions are directly in contact with each other.

13. The method for manufacturing a display device according to claim 1, further comprising:
    forming a bank over the light emitting element, the bank having a hole,
    wherein the plurality of protrusions are formed in the hole.

14. The method for manufacturing a display device according to claim 1, wherein the deposition is performed by a vapor deposition method.

15. The method for manufacturing a display device according to claim 1, wherein the deposition is performed so that the deposited organic material is spontaneously transformed to the plurality of protrusions.

* * * * *